(12) United States Patent
Miyazaki et al.

(10) Patent No.: US 10,281,210 B2
(45) Date of Patent: May 7, 2019

(54) SUBSTRATE PROCESSING APPARATUS AND SUBSTRATE PROCESSING METHOD

(71) Applicant: SHIBAURA MECHATRONICS CORPORATION, Yokohama-shi (JP)

(72) Inventors: Kunihiro Miyazaki, Yokohama (JP); Konosuke Hayashi, Yokohama (JP); Takashi Ootagaki, Yokohama (JP); Yuji Nagashima, Yokohama (JP)

(73) Assignee: SHIBAURA MECHATRONICS CORPORATION, Yokohama-shi (JP)

( * ) Notice: Subject to any disclaimer, the term of this patent is extended or adjusted under 35 U.S.C. 154(b) by 241 days.

(21) Appl. No.: 14/773,055

(22) PCT Filed: Feb. 28, 2014

(86) PCT No.: PCT/JP2014/055054
§ 371 (c)(1),
(2) Date: Sep. 4, 2015

(87) PCT Pub. No.: WO2014/136670
PCT Pub. Date: Sep. 12, 2014

(65) Prior Publication Data
US 2016/0025409 A1    Jan. 28, 2016

(30) Foreign Application Priority Data

Mar. 7, 2013   (JP) .................................. 2013-045532
Jul. 4, 2013   (JP) .................................. 2013-140416
Feb. 18, 2014  (JP) .................................. 2014-028314

(51) Int. Cl.
*F26B 3/30*  (2006.01)
*F26B 7/00*  (2006.01)
(Continued)

(52) U.S. Cl.
CPC .................. *F26B 3/30* (2013.01); *F26B 3/28* (2013.01); *F26B 5/005* (2013.01); *F26B 7/00* (2013.01);
(Continued)

(58) Field of Classification Search
CPC ......... H01L 21/67098; H01L 21/67028; H01L 21/67034; H01L 21/02057;
(Continued)

(56) References Cited

U.S. PATENT DOCUMENTS 5,882,433 A   3/1999  Ueno
6,016,612 A   1/2000  Kruwinus
(Continued)

FOREIGN PATENT DOCUMENTS

CN   102099900 A   6/2011
JP   9-38595 A     2/1997
(Continued)

OTHER PUBLICATIONS

JP2004119717 (Dainippon Screen Mfg) Apr. 15, 2004, English Translation of abstract, description [retrieved on Dec. 8, 2017]. Retrieved from Google Patents.*

(Continued)

*Primary Examiner* — Jessica Yuen
(74) *Attorney, Agent, or Firm* — Oblon, McClelland, Maier & Neustadt, L.L.P.

(57) ABSTRACT

According to one embodiment, a substrate processing apparatus (1) includes a table (4) configured to support a substrate W, a solvent supply unit (8) configured to supply a volatile solvent to a surface of the substrate W on the table (4), and an irradiator (10) configured to emit light to the substrate W, which has been supplied with the volatile solvent, and function as a heater that heats the substrate W such that a gas layer is formed on the surface of the substrate (Continued)

W to make the volatile solvent into a liquid ball. Thus, it is possible to dry the substrate successfully as well as to suppress pattern collapse.

10 Claims, 9 Drawing Sheets

(51) Int. Cl.
*F26B 11/18* (2006.01)
*F26B 3/28* (2006.01)
*H01L 21/02* (2006.01)
*H01L 21/67* (2006.01)
*F26B 5/00* (2006.01)

(52) U.S. Cl.
CPC ........ *F26B 11/18* (2013.01); *H01L 21/02057* (2013.01); *H01L 21/67034* (2013.01); *H01L 21/67115* (2013.01)

(58) Field of Classification Search
CPC ........ H01L 21/67115; F26B 3/22; F26B 3/24; F26B 5/08; F26B 3/30; F26B 3/28; F26B 5/005; F26B 7/00; F26B 11/18
USPC ........... 34/274, 397; 348/477, 905, 906, 974
See application file for complete search history.

(56) References Cited

U.S. PATENT DOCUMENTS

| | | | |
|---|---|---|---|
| 2001/0017103 A1* | 8/2001 | Takeshita | B05D 1/005 118/50 |
| 2007/0295365 A1 | 12/2007 | Miya et al. | |
| 2011/0155177 A1 | 6/2011 | Tamura et al. | |
| 2012/0103371 A1 | 5/2012 | Yun et al. | |
| 2012/0160274 A1 | 6/2012 | Kasai et al. | |
| 2012/0264308 A1* | 10/2012 | Watanabe | H01L 21/3105 438/757 |

FOREIGN PATENT DOCUMENTS

| | | |
|---|---|---|
| JP | 10 199855 | 7/1998 |
| JP | 2004-119717 A | 4/2004 |
| JP | 2008-34428 A | 2/2008 |
| JP | 2008 34779 | 2/2008 |
| JP | 2010-161165 A | 7/2010 |
| JP | 2010 238918 | 10/2010 |
| JP | 2012-503883 A | 2/2012 |
| JP | 2012 138510 | 7/2012 |
| JP | 2012-178606 A | 9/2012 |
| JP | 2002 305178 | 10/2012 |
| TW | 201234454 A1 | 8/2012 |
| WO | WO 2012/056343 A2 | 5/2012 |

OTHER PUBLICATIONS

Extended European Search Report dated Oct. 7, 2016 in Patent Application No. 14760514.1.
Combined Chinese Office Action and Search Report dated Aug. 25, 2016 in Patent Application No. 103107697 (with English translation and English translation of categories of cited documents).
International Search Report dated Apr. 22, 2014 in PCT/JP2014/055054 filed Feb. 28, 2014.
Office Action dated Aug. 22, 2017 in Japanese Patent Application No. 2014-028314 (with English language translation).
Combined Chinese Office Action and Search Report dated Nov. 23, 2016 in Patent Application No. 201480010842.3 (with English Translation and English Translation of Category of Cited Documents).

* cited by examiner

SUBSTRATE PROCESSING APPARATUS AND SUBSTRATE PROCESSING METHOD

TECHNICAL FIELD

Embodiments described herein relate generally to a substrate processing apparatus and a substrate processing method.

BACKGROUND ART

A substrate processing apparatus is used in the process of manufacturing semiconductor devices and the like to supply a treatment liquid to a surface of a substrate, such as a wafer or a liquid crystal substrate, to thereby treat the surface, and then dry the surface. In this drying process, due to the miniaturization along with the higher integration and larger capacity of recent semiconductors, for example, pattern collapse occurs around the memory cells and the gate. This is caused by structure and spacing between patterns, a surface tension of the treatment liquid, and the like.

To suppress the above-mentioned pattern collapse, there has been proposed a technology for drying a substrate with IPA (2-propanol: isopropyl alcohol) having a surface tension lower than that of ultrapure water (e.g., see Patent Document 1). Production plants employ a method for drying a substrate by replacing ultrapure water on the surface of the substrate with IPA.

PRIOR ART DOCUMENT

Patent Document

[Patent Document 1] Japanese Unexamined Patent Application Publication No. 2008-34779

SUMMARY OF THE INVENTION

Problems to be Solved by the Invention

As the miniaturization of semiconductors has been increasingly progressing, even if drying is performed using a highly-volatile organic solvent such as IPA, a fine pattern on a wafer sometimes collapses due to the surface tension of the liquid.

For example, if nonuniformity occurs in the drying rate of the substrate surface in the process in which a liquid is dried, and some liquid remains between part of patterns, pattern collapse occurs due to the surface tension of the liquid in that portion. In particular, the patterns in the portion where the liquid remains fall over by elastic deformation due to the surface tension of the liquid. The residues slightly dissolved in the liquid are aggregated. After that, when the liquid is completely vaporized, the fallen patterns adhere to one another and thus collapse.

An object of the present invention is to provide a substrate processing apparatus and a substrate processing method capable of drying a substrate successfully while suppressing pattern collapse.

Means of Solving the Problems

According to one embodiment, a substrate processing apparatus includes: a solvent supply unit configured to supply a volatile solvent to a surface of a substrate; and a heater configured to heat the substrate such that a gas layer is formed on the surface of the substrate, which has been supplied with the volatile solvent, to make the volatile solvent into a liquid ball.

According to another embodiment, a substrate processing method includes: supplying a volatile solvent to a surface of a substrate; and heating the substrate such that a gas layer is formed on the surface of the substrate, which has been supplied with the volatile solvent, to make the volatile solvent into a liquid ball.

Effects of the Invention

According to the present invention, it is possible to dry a substrate successfully as well as to suppress pattern collapse.

MODES FOR CARRYING OUT THE INVENTION

First Embodiment

A first embodiment will be described with reference to FIGS. 1 to 4.

Figure 1:
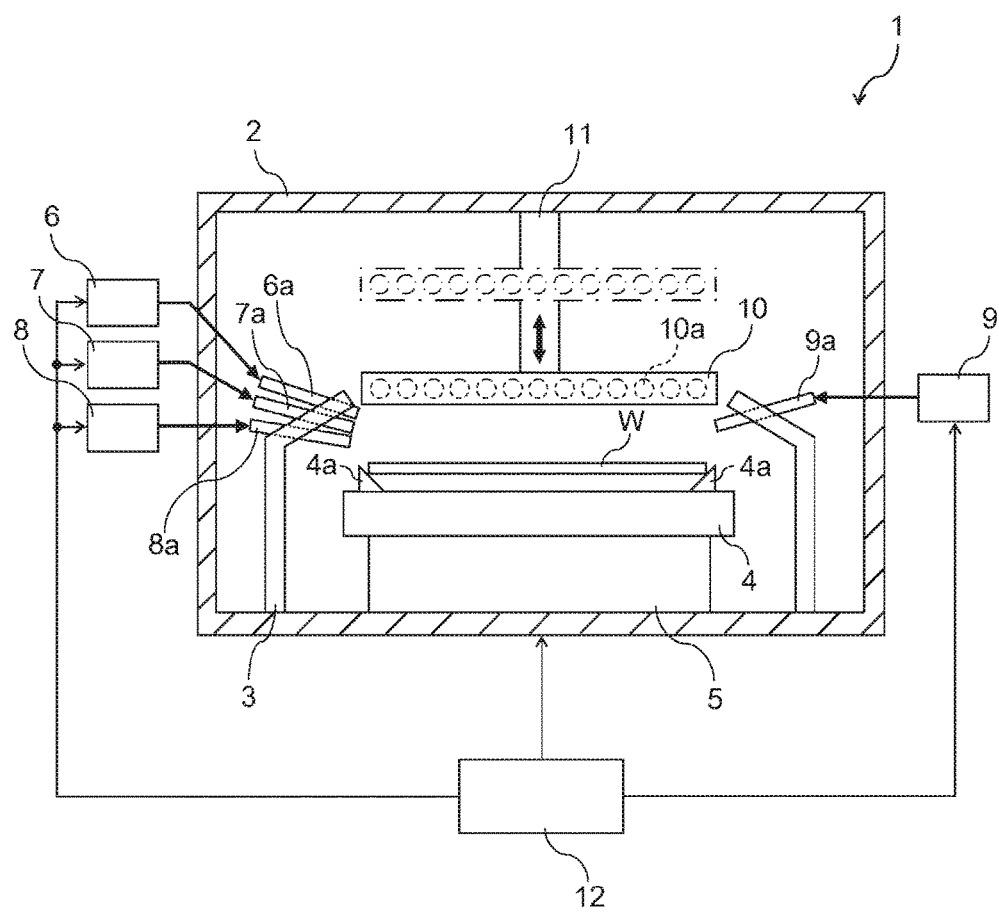
FIG. 1 is a diagram illustrating a schematic structure of a substrate processing apparatus according to a first embodiment.

As illustrated in FIG. 1, a substrate processing apparatus 1 of the first embodiment includes treatment box 2 as a treatment chamber, a cup 3 arranged in the treatment box 2, a table 4 configured to support a substrate W horizontally in the cup 3, and a rotation mechanism 5 configured to rotate the table 4 in a horizontal plane. The substrate processing apparatus 1 further includes a first treatment liquid supply unit 6 configured to supply a first treatment liquid to the surface of the substrate W on the table 4, a second treatment liquid supply unit 7 configured to supply a second treatment liquid to the surface of the substrate W on the table 4, a solvent supply unit 8 configured to supply a volatile solvent, a gas supply unit 9 configured to supply a gas, an irradiator 10 configured to emit light, a movement mechanism 11 configured to move the irradiator 10, and a controller 12 configured to control each unit.

The cup 3 is formed in a cylindrical shape, and surrounds the periphery of the table 4 to accommodate it therein. The cup 3 includes a peripheral wall having an upper portion inclined inwardly in the radial direction, and an opening to expose the substrate W on the table 4. The cup 3 is configured to receive a treatment liquid flowing down or scattered from the rotating substrate W. Incidentally, the treatment liquid received is discharged through a discharge pipe (not illustrated) arranged in the bottom of the cup 3.

The table 4 is located near the center in the cup 3 to be rotatable in the horizontal plane. The table 4 includes a plurality of support members 4a such as pins. The table 4 removably holds the substrate W such as a wafer or a liquid crystal substrate by the support members 4a.

The rotation mechanism 5 includes a rotation shaft connected to the table 4 and a motor as a driving source to rotate the rotation shaft (both not illustrated). The rotation mechanism 5 is configured to rotate the table 4 via the rotation shaft by driving the motor. The rotation mechanism 5 is electrically connected to the controller 12, and operates under the control of the controller 12.

The first treatment liquid supply unit 6 includes a nozzle 6a configured to eject the first treatment liquid from an oblique direction with respect to the surface of the substrate W on the table 4. The first treatment liquid, such as, for example, APM (a mixture of ammonia water and hydrogen peroxide water) for resist stripping, is supplied from the nozzle 6a to the surface of the substrate W on the table 4. The nozzle 6a is arranged on the upper portion of the peripheral wall of the cup 3, and its angle and ejection flow rate are adjusted such that the first treatment liquid is supplied to near the center of the surface of the substrate W. The first treatment liquid supply unit 6 is electrically connected to the controller 12, and operates under the control of the controller 12. The first treatment liquid supply unit further includes a tank for storing the first treatment liquid, a pump as a driving source, and a regulating valve for regulating the supply amount (all not illustrated).

The second treatment liquid supply unit includes a nozzle 7a configured to eject the second treatment liquid from an oblique direction with respect to the surface of the substrate W on the table 4. The second treatment liquid, such as, for example, pure water for washing (ultrapure water), is supplied from the nozzle 7a to the surface of the substrate W on the table 4. The nozzle 7a is arranged on the upper portion of the peripheral wall of the cup 3, and its angle and ejection flow rate are adjusted such that the second treatment liquid is supplied to near the center of the surface of the substrate W. The second treatment liquid supply unit 7 is electrically connected to the controller 12, and operates under the control of the controller 12. The second treatment liquid supply unit 7 further includes a tank for storing the second treatment liquid, a pump as driving source, and a regulating valve for regulating the supply amount (all not illustrated).

The solvent supply unit 8 includes a nozzle 8a configured to eject a volatile solvent from an oblique direction with respect to the surface of the substrate W on the table 4. The volatile solvent such as, for example, IPA is supplied from the nozzle 8a to the surface of the substrate W on the table 4. The nozzle 8a is arranged on the upper portion of the peripheral wall of the cup 3, and its angle and ejection flow rate are adjusted such that the volatile solvent is supplied to near the center of the surface of the substrate W. The solvent supply unit 8 is electrically connected to the controller 12, and operates under the control of the controller 12. The solvent supply unit 8 further includes a tank for storing the volatile solvent, a pump as a driving source, and a regulating valve for regulating the supply amount (all not illustrated).

Examples of the volatile solvent include, in addition to IPA, monohydric alcohols such as ethanol, ethers such as diethyl ether and ethyl methyl ether, and the like. The volatile solvent is preferably soluble in water.

The gas supply unit 9 includes a nozzle 9a configured to eject a gas from an oblique direction with respect to the surface of the substrate W on the table 4. The gas such as, for example, nitrogen gas is supplied from the nozzle 9a to the surface of the substrate W on the table 4 to bring a space on the surface of the substrate W into a nitrogen gas atmosphere. The nozzle 9a is arranged on the upper portion of the peripheral wall of the cup 3, and its angle and ejection flow rate are adjusted such that the gas is supplied to near the center of the surface of the substrate W. The gas supply unit 9 is electrically connected to the controller 12, and operates under the control of the controller 12. The gas supply unit 9 further includes a tank for storing the gas and a regulating valve for regulating the supply amount (both not illustrated).

Examples of the gas supplied include inert gas other than nitrogen gas, such as argon gas, carbon dioxide gas, helium gas, and the like. The inert gas supplied to the surface of the substrate W removes oxygen therefrom. This prevents the generation of watermark (water stain). The gas supplied is preferably a heated gas.

The irradiator 10 includes a plurality of lamps 10a. The irradiator 10 is arranged above the table 4, and irradiates the surface of the substrate W on the table 4 with light by the lighting of the lamps 10a. The irradiator 10 is configured to be movable by the movement mechanism 11 in the vertical direction (up and down directions), and move between an irradiation position close to the cup 3 (as indicated by a solid line in FIG. 1, a position close to the surface of the substrate W) and a standby position at a predetermined distance from the cup 3 (as indicated by a chain line in FIG. 1, a position spaced from the surface of the substrate W). The irradiator 10 is electrically connected to the controller 12, and operates under the control of the controller 12.

The irradiator 10 may be, for example, a plurality of straight tube lamps (10a) arranged in parallel, an array of a plurality of bulb lamps (10a), or the like. Further, the lamps 10a may be, for example, halogen lamps, xenon flash lamps, or the like (e.g., flash lamps having a wavelength of 400 nm to 1000 nm).

The irradiator 10 functions as a heater for heating the substrate W. The irradiator 10 may be a variety of irradiators that irradiate the substrate W on the table 4 with electromagnetic waves, and, instead of the lamps 10a that emit light, it may include, for example, a far-infrared heater that irradiates the substrate W with far-infrared rays, a microwave heater that irradiates microwaves, or the like.

The movement mechanism 11 includes a holder for holding the irradiator 10, a mechanism for moving the holder in the up and down directions of the irradiator 10, a motor as a driving source (all not illustrated). The irradiator 10 moves together with the holder by driving the motor. The movement mechanism 11 is electrically connected to the controller 12, and operates under the control of the controller 12.

The controller 12 includes a microcomputer that centrally controls each unit, and a storage that stores various programs and substrate processing information related to substrate processing. The controller 12 controls the rotation mechanism 5, the first treatment liquid supply unit 6, the second treatment liquid supply unit 7, the solvent supply unit 8, the gas supply unit 9, the irradiator 10, the movement mechanism 11, and the like based on the substrate processing information and the various programs. Thereby, the controller 12 controls, with respect to the surface of the substrate W on the rotating table 4, the supply of the first treatment liquid by the first treatment liquid supply unit 6, the supply of the second treatment liquid by the second treatment liquid supply unit 7, the supply of volatile solvent by the solvent supply unit 8, the supply of gas by the gas supply unit 9, the irradiation (heating) by the irradiator 10, and the like.

In the following, substrate processing (substrate processing method) performed by the substrate processing apparatus 1 will be described with reference to FIG. 2. It is assumed that the substrate W is set on the table 4, and pre-preparation has been completed. The irradiator 10 is waiting in the standby position at a predetermined distance from the cup 3 (see the chain line in FIG. 1).

Figure 2:
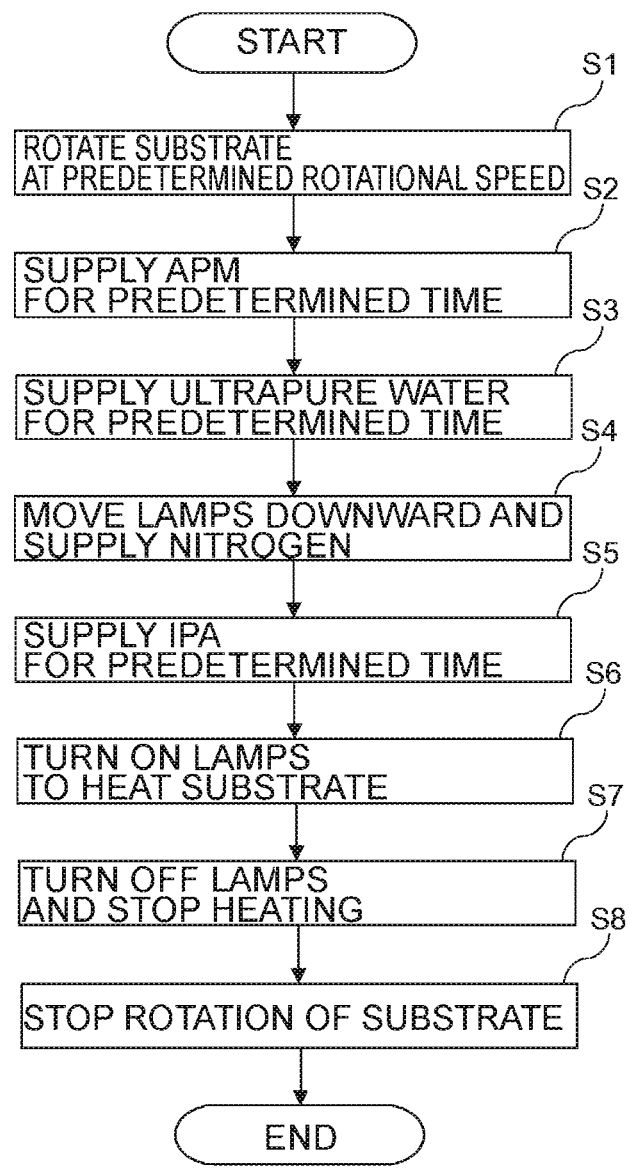
FIG. 2 is flowchart illustrating the procedure of substrate processing of the first embodiment.

As illustrated in FIG. 2, first, the controller 12 controls the rotation mechanism 5 to rotate the table 4 at a predetermined rotational speed (step S1). Then, the controller 12 controls the first treatment liquid supply unit 6 to supply the first treatment liquid, i.e., APM, from the first nozzle 6a to the surface of the substrate W on the rotating table 4 for a predetermined time (step S2). The APM as the first treatment liquid is ejected from the first nozzle 6a toward the center of the substrate W on the rotating table 4, and spreads over the entire surface of the substrate W by the centrifugal force due to the rotation of the substrate W. With this, the surface of the substrate W on the table 4 is covered by the APM and thereby treated. The processing conditions such as the rotational speed of the table 4 and the predetermined time are set in advance, but can be changed arbitrarily by the operator.

After step S2, the controller 12 stops the supply of the first treatment liquid, and then controls the second treatment liquid supply unit 7 to supply the second treatment liquid, i.e., ultrapure water, from the second nozzle 7a to the surface of the substrate W on the rotating table 4 for a predetermined time (step S3). The ultrapure water as the second treatment liquid is ejected from the second nozzle 7a toward the center of the substrate W on the rotating table 4, and spreads over the entire surface of the substrate W by the centrifugal force due to the rotation of the substrate W. With this, the surface of the substrate W on the table 4 is covered with the ultrapure water and thereby cleaned.

After step S3, the controller 12 stops the supply of the second treatment liquid, and then controls the movement mechanism 11 to move the irradiator 10 downward from the standby position to the irradiation position. Further, the controller 12 controls the gas supply unit 9 to supply gas, i.e., nitrogen gas, from the nozzle 9a to the surface of the substrate W on the rotating table 4 for a predetermined time (step S4). At this time, each of the lamps 10a of the irradiator 10 is not lit. The nitrogen gas is ejected from the nozzle 9a toward the center of the substrate W on the rotating table 4, and spreads over the entire surface of the substrate W by the air flow caused by the rotation of the substrate W. With this, a space between the surface of the substrate W on the table 4 and the irradiator 10 is brought into a nitrogen atmosphere. By bringing the space into the nitrogen atmosphere, the oxygen concentration is reduced, and thus water marks are prevented from occurring on the surface of the substrate W. Incidentally, since the space between the surface of the substrate W on the table 4 and the irradiator 10 has become narrow by the movement of the irradiator 10 from the standby position to the irradiation position, it takes less time to bring the space into the nitrogen atmosphere, thus achieving a reduction in the overall processing time.

After step S4, the controller 12 stops the supply of nitrogen gas, and then controls the solvent supply unit 8 to supply a volatile solvent, i.e., IPA, from the nozzle 8a to the surface of the substrate W on the rotating table 4 for a predetermined time (step S5). The supply of the IPA is preferably carried out before the ultrapure water is dried. The IPA as the volatile solvent is ejected from the nozzle 8a toward the center of the substrate W on the rotating table 4, and spreads over the entire surface of the substrate W by the centrifugal force due to the rotation of the substrate W. With this, the ultrapure water is replaced with the IPA on the surface of the substrate W on the table 4. At this time, the temperature of the IPA ejected from the nozzle 8a of the solvent supply unit 8 is below its boiling point. As the IPA surely in the liquid state is supplied to the surface of the substrate W, the ultrapure water is uniformly replaced by the IPA over the entire surface of the substrate W. In this embodiment, liquid IPA is continuously fed to the substrate W.

Incidentally, while the IPA is being supplied, the rotational speed of the table 4, i.e., the rotational speed of the substrate W, is set such that the film of the volatile solvent formed on the surface of the substrate W is thin to the extent that the surface is not exposed. As for the supply of the nitrogen gas from the nozzle 9a, it may be continued in step S5 without being stopped after step S4.

After step S5, the controller 12 stops the supply of the volatile solvent, and then controls the irradiator 10 to turn on the lamps 10a to heat the substrate W on the rotating table 4 for a predetermined time (step S6). At this time, the irradiator 10 can heat the substrate W to 100° C. or higher in 10 seconds. This enables instant drying of the surface of the substrate W having residual IPA. Although the heating by the irradiation of the irradiator 10 has been described as being started after the supply of IPA is stopped, it is not a limitation. The heating may be started during the supply of IPA.

In the heating and drying by the irradiator 10, to suppress pattern collapse, it is important to heat the substrate W to 100° C. or higher in a few seconds as described above. Besides, it is also required to heat only the substrate W without heating the IPA. To achieve this instantaneous reach to a high temperature, the irradiator 10 desirably has a peak intensity at a wavelength ranging from 400 to 3000 nm. Moreover, to ensure the drying, the final temperature of the substrate W (the final temperature reached by heating) is preferably a heating temperature 20° C. or more higher than the boiling point of the treatment liquid or the solvent at atmospheric pressure. Desirably, the time taken to reach the final temperature is 10 seconds or less, preferably, for example, in the range of a few 10 milliseconds to a few seconds.

After step S6, the controller 12 controls the movement mechanism 11 to move the irradiator 10 upward from the irradiation position to the standby position. The controller 12 then controls the irradiator 10 to turn off the lamps 10a, thereby stopping the heating of the substrate W (step S7). Finally, the controller 12 controls the rotation mechanism 5 to stop the rotation of the substrate W (step S8), and the processing ends. Thereafter, the substrate W is taken out from the support members 4a of the table 4.

Incidentally, prior to taking out the substrate W, the irradiator 10 is positioned in the standby position. Therefore, the irradiator 10 can be prevented from getting in the way when the substrate W is taken out. The irradiator 10 positioned in the standby position is prevented from getting in the way also when the substrate W is set on the table 4 in the treatment box 2. Further, when the first treatment liquid or the second treatment liquid is being supplied to the substrate W, if the irradiator 10 is positioned in the standby position, the treatment liquid can be prevented from adhering to the irradiator 10.

Figure 3:
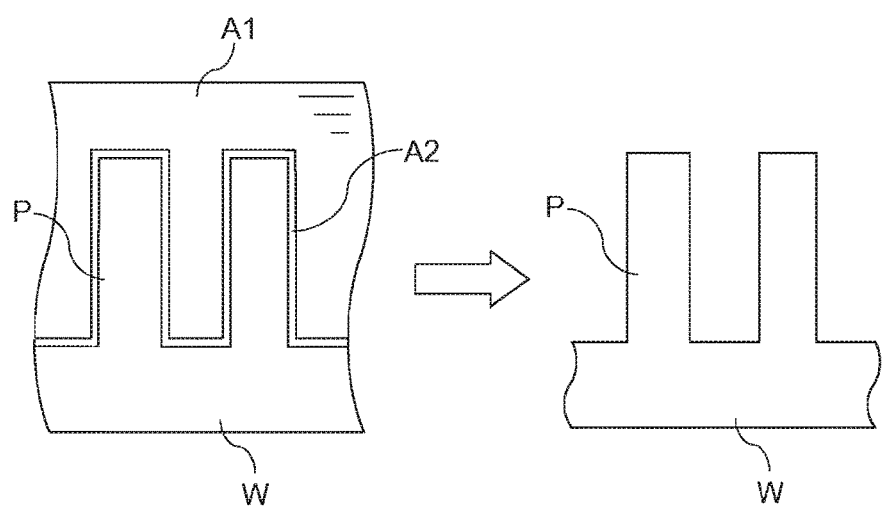
FIG. 3 is an explanatory diagram for explaining a drying process by an irradiator of the first embodiment.

In the drying process with the irradiator 10 described above (step S6), due to the heating by the irradiator 10, liquid A1 is vaporized from the periphery of a pattern P on the surface of the substrate W as illustrated in FIG. 3. Accordingly, the substrate surface dries instantly. At this time, the irradiator 10 heats only the substrate W instantly to the final temperature such that an air layer A2 is formed on the surface of the substrate W, which has been supplied with the liquid A1, to make the liquid A1 into a liquid ball (to produce a droplet of the liquid A1).

For details, when the substrate W is heated instantaneously by the irradiation of the irradiator 10, the liquid A1 in contact with the pattern P on the surface of the substrate W starts vaporizing earlier than the liquid A1 in other portions. With this, in the periphery of the pattern P on the surface of the substrate W, a layer of gas (a set of bubbles), i.e., the air layer A2, is formed as a thin film by the evaporation (boiling) of the liquid A1. Accordingly, the drying proceeds as the liquid A1 between adjacent patterns P is being pushed to the surface of the substrate W by the air layer A2.

In other words, by heating the substrate W instantaneously, the liquid A1 of volatile solvent in contact with the pattern P on the surface of the substrate W is vaporized instantly. The liquid A1 of volatile solvent in other portions on the surface of the substrate W is immediately made into a liquid ball (liquid ball phenomenon). The liquid ball thus generated is blown off from the substrate W by the centrifugal force due to the rotation of the substrate W. As a result, the drying of the substrate W is completed. In this manner, it is possible to reduce the liquid A1 that remains in part of patterns. This provides a uniform drying rate of the liquid A1 on the surface of the substrate W. Thus, the pattern P can be prevented from collapsing due to a collapsing force (e.g., surface tension, etc.) caused by the remaining liquid A1.

Figure 4:
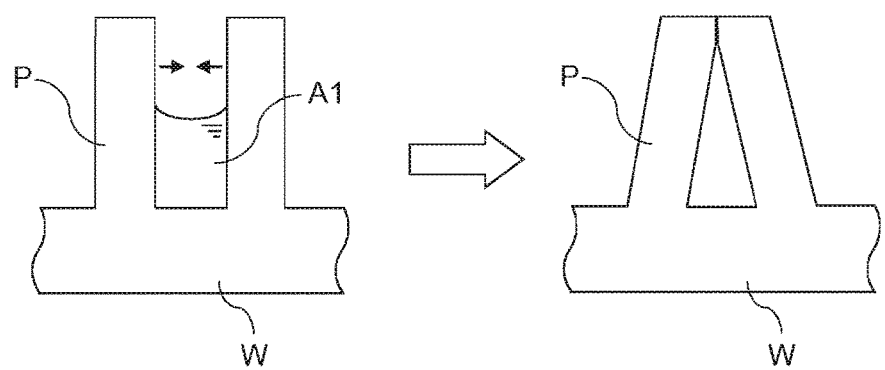
FIG. 4 is an explanatory diagram for explaining a drying process without using the irradiator of the first embodiment.

On the other hand, in the drying without the irradiator 10, nonuniformity occurs in the drying rate of the liquid A1 in the process in which the liquid A1 of IPA is dried. Consequently, as illustrated in FIG. 4, the liquid A1 remains between part of the patterns P, and the pattern P is collapsed due to a collapsing force caused by the liquid A1 in the portion. For example, each of the patterns P has a width of 20 nm and a height of 200 nm (the height is 10 times the width). Like this, the patterns P are so fine that the liquid A1 having entered between them is difficult to dry. Therefore, even after other portions have dried, the liquid A1 remains in part of the patterns P, resulting in pattern collapse due to a collapsing force caused by the liquid A1.

As described above, according to the first embodiment, the substrate W, which has been supplied with a volatile solvent (e.g., IPA), is irradiated with light to be heated so that a layer of gas (gas layer) is formed on the surface of the substrate W. This promotes the vaporization (boiling) of the volatile solvent in contact with a pattern on the substrate W. The gas layer formed in this time enables the surface of the substrate W to dry in an instant without leaving the volatile solvent between the patterns. In this manner, the volatile solvent is prevented from remaining between the patterns, and thereby pattern collapse is prevented from occurring due to residual volatile solvent. Thus, the substrate can be dried successfully with less pattern collapse.

In addition, the substrate is heated by the irradiation of the irradiator 10 after the completion of the supply of the volatile solvent. Accordingly, even if the supply is not so plentiful, the entire surface of the substrate W can be reliably covered with a small amount of the volatile solvent. Thus, reliable drying can be achieved. That is, when the heating is performed during the supplying period, the volatile solvent is vaporized by the heat while being supplied. As a result, the volatile solvent may not spread over the entire surface of the substrate. This can be prevented when the heating is performed after the completion of the supply of the volatile solvent.

Meanwhile, if the volatile solvent is sufficiently supplied and spread over the entire surface of the substrate, the irradiator 10 may start the heating by the irradiation during the supply of the volatile solvent. In this case, it takes less time to dry the substrate W as compared to the case where the heating is started after the completion of the supply of the volatile solvent. Thus, the overall processing time can be reduced.

While, in the embodiment described above, APM is used as the first treatment liquid, this is not a limitation. For example, SPM (a mixture of sulfuric acid and hydrogen peroxide water) may be used. Although APM hardly reacts with IPA, SPM reacts readily with IPA. To avoid the reaction between SPM and IPA, it is desirable to separately provide a first spin processing module for SPM treatment and a second spin processing module for heating and IPA drying by the irradiator 10. In this case, after the SPM process of the first spin processing module, the substrate W is transported to the second spin processing module without having been subjected to a drying process, and the second spin processing module performs the drying process.

In the embodiment described above, the supply of the volatile solvent, such as IPA, is started after the completion of the supply of washing liquid to the substrate W. However, the supply of the volatile solvent may be started at the end of washing with the second treatment liquid, such as ultra-pure water, from when the treatment liquid is still being supplied to the substrate W.

Second Embodiment

A second embodiment will be described with reference to FIG. 5.

The second embodiment is basically similar to the first embodiment. Therefore, in the second embodiment, a description is given only of differences from the first embodiment. Like parts as described in the first embodiment are designated by like reference numerals, and the description thereof is omitted.

Figure 5:
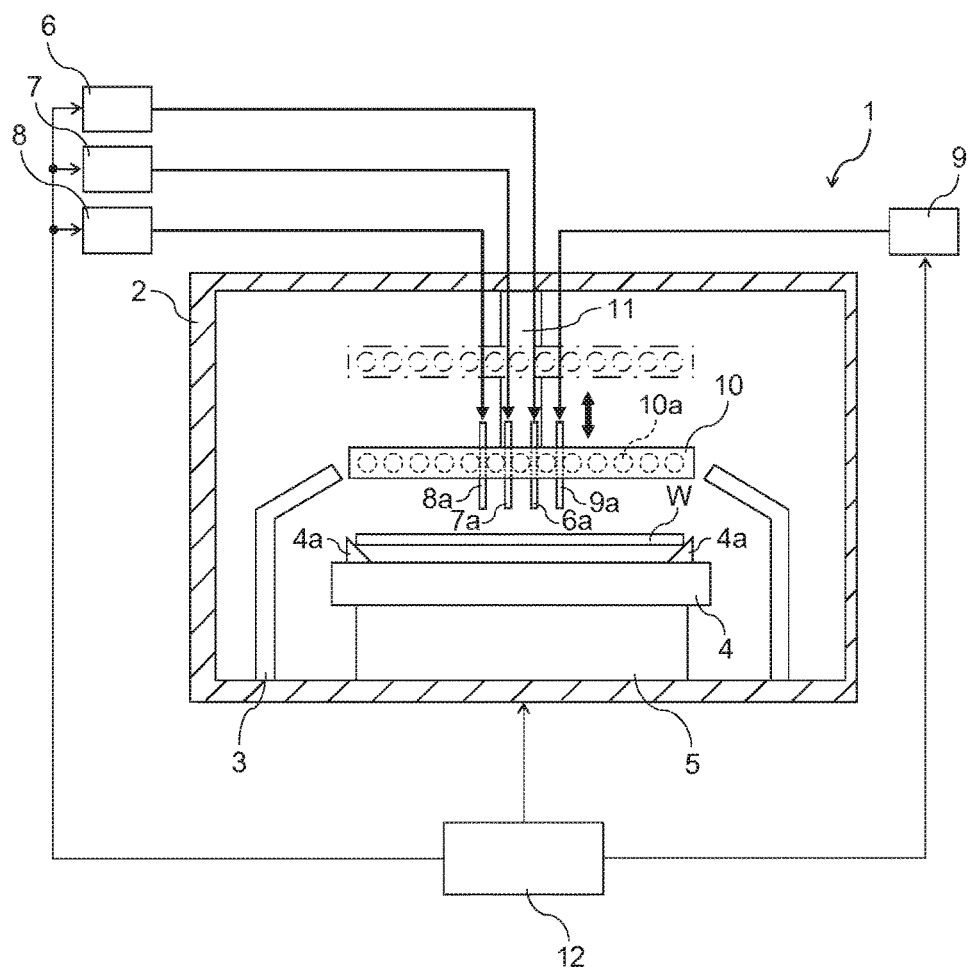
FIG. 5 is a diagram illustrating a schematic structure of a substrate processing apparatus according to a second embodiment.

As illustrated in FIG. 5, in the substrate processing apparatus 1 of the second embodiment, the nozzle 6a of the first treatment liquid supply unit 6, the nozzle 7a of the second treatment liquid supply unit 7, the nozzle 8a of the solvent supply unit 8, and the nozzle 9a of the gas supply unit 9 are arranged in the irradiator 10. The nozzles 6a, 7a, 8a and 9a are configured to be capable of supplying their respective fluids (first treatment liquid, second treatment liquid, volatile solvent, and gas) to the surface of the substrate W on the table 4. Each of the nozzles 6a, 7a, 8a and 9a is made of a material that is not deformed by heat, such as, for example, quartz that is not heated by the lamps 10a of the irradiator 10.

In the substrate processing apparatus 1 of the second embodiment, the nozzles 6a, 7a, 8a and 9a are located directly above the substrate W on the table 4. Therefore, even if the flow rate of liquid or gas being supplied is low, the liquid or gas can be easily supplied to the center of the substrate. Moreover, even if the flow amount of liquid being supplied is reduced, the surface of the substrate W can be coated with the liquid. Thus, the consumption of the liquid can be reduced. Similarly, even if the flow amount of gas being supplied is reduced, the space above the surface of the substrate W can be brought into the atmosphere of the gas. Thus, the consumption of the gas can be reduced.

As described above, according to the second embodiment, the same effect as in the first embodiment can be achieved. Besides, since the nozzles 6a, 7a, 8a and 9a are located in the irradiator 10, even when the flow rate of liquid or gas being supplied is low, the liquid or gas can be easily supplied to the center of the substrate. In addition, the flow amount of liquid and gas can be reduced, resulting in less consumption of the liquid and gas.

Third Embodiment

A third embodiment will be described with reference to FIG. 6.

The third embodiment is basically similar to the second embodiment. Therefore, in the third embodiment, a description is given only of differences from the second embodiment. Like parts as described in the second embodiment are designated by like reference numerals, and the description thereof is omitted.

Figure 6:
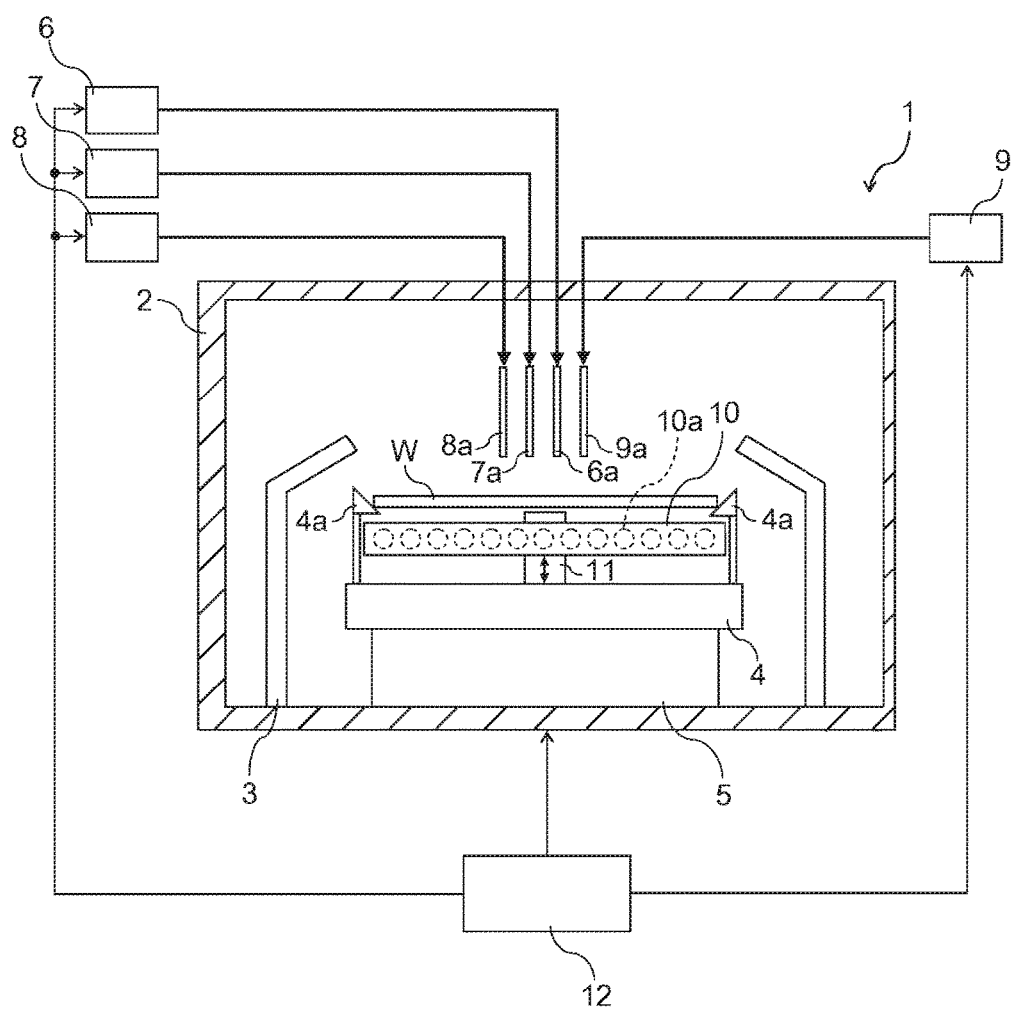
FIG. 6 is a diagram illustrating a schematic structure of a substrate processing apparatus according to a third embodiment.

As illustrated in FIG. 6, in the substrate processing apparatus 1 of the third embodiment, the irradiator 10 is arranged below the substrate W, i.e., between the substrate W on the support members 4a and the table 4, to irradiate the table 4 side surface of the substrate W with light. As in the second embodiment, the irradiator 10 is movable in the vertical direction (up and down directions) by the movement mechanism 11.

In the substrate processing apparatus 1 of the third embodiment, the irradiator 10 is located between the substrate W on the support members 4a and the table 4. Thus, a space above the substrate W on the support members 4a can be cleared. Accordingly, other members or devices (e.g., the nozzles 6a, 7a, 8a, 9a, etc.) can be arranged easily in the space without having a complicated structure.

As described above, according to the third embodiment, the same effect as in the second embodiment can be achieved. Besides, the irradiator 10 is located below the substrate W, for example, between the substrate W on the support members 4a and the table 4. With this, a space above the substrate W on the support members 4a can be cleared. Thus, other members, devices, or the like can be arranged easily in the space.

Fourth Embodiment

A fourth embodiment will be described with reference to FIGS. 7 to 9.

The fourth embodiment is basically similar to the first embodiment. Therefore, in the fourth embodiment, a description is given only of differences from the first embodiment. Like parts as described in the first embodiment are designated by like reference numerals, and the description thereof is omitted.

Figure 7:
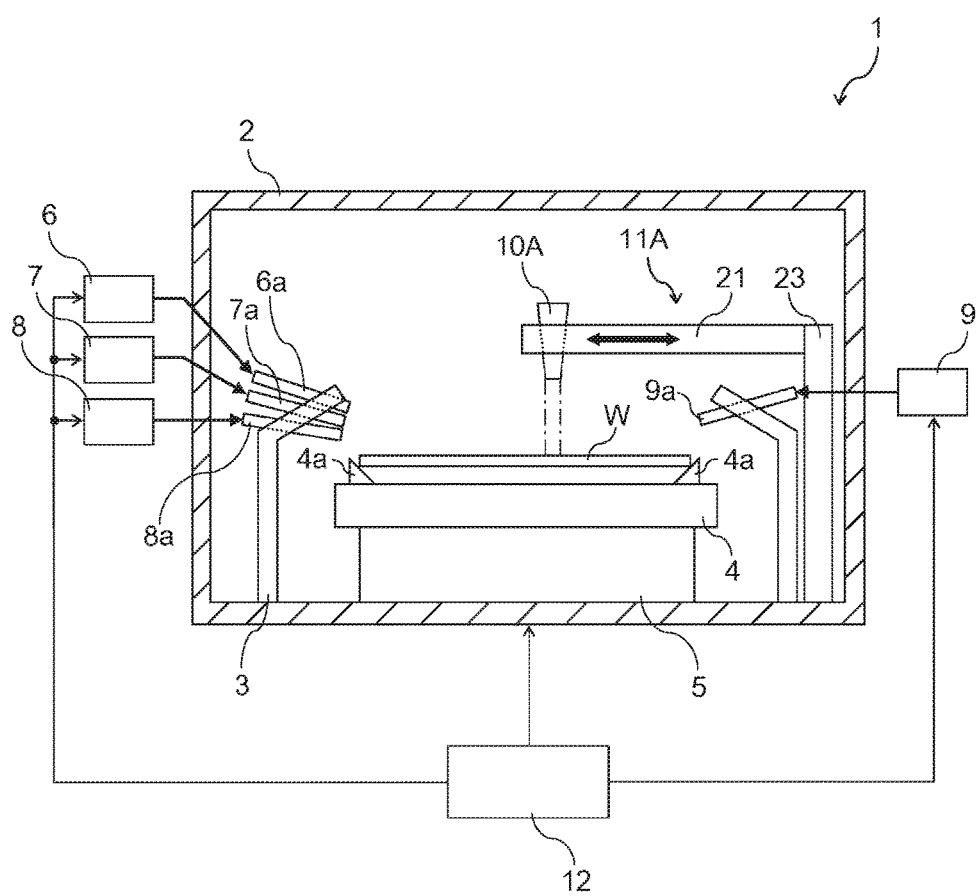
FIG. 7 is a diagram illustrating a schematic structure of a substrate processing apparatus according to a fourth embodiment.
Figure 8:
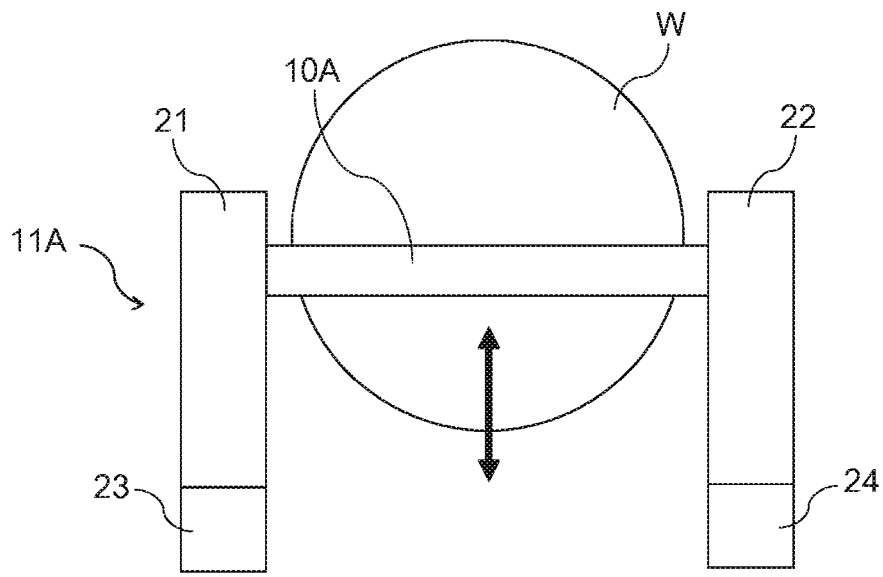
FIG. 8 is a plan view illustrating a schematic structure of a movement mechanism for an irradiator of the fourth embodiment.

As illustrated in FIGS. 7 and 8, in the substrate processing apparatus 1 of the fourth embodiment, an irradiator 10A is a line laser which emits a laser beam line. The irradiator 10A has a longitudinal length longer than the diameter of the substrate W, and is configured to be movable by a movement mechanism 11A along the surface of the substrate W on the table 4. As in the first embodiment, the irradiator 10A heats the substrate W, which has been supplied with a volatile solvent, to produce a layer of gas (air layer) on its surface.

The movement mechanism 11A includes a pair of movement mechanisms 21 and 22 (see FIG. 8) that move the irradiator 10A while holding it, a supporting column 23 that supports the movement mechanism 21, and a supporting column 24 that supports the movement mechanism 22 (see FIG. 8). The movement mechanisms 21 and 22 hold the irradiator 10A so that the irradiator 10A is positioned above the substrate W on the table 4, and move it in parallel along the surface of the substrate W on the table 4. The movement mechanisms 21 and 22 may be, for example, those of the feed screw type using a servomotor as a driving source, those of the linear motor type using a linear motor as a driving source, or the like.

In the substrate processing apparatus 1 of the fourth embodiment, to perform heating for drying, the irradiator 10A emits laser beams while being moved by the movement mechanisms 21 and 22 in parallel along the surface of the substrate W on the rotating table 4, thereby irradiating the entire surface of the substrate W with the laser beams. At this time, for example, the irradiator 10A is moved from the center to the outer periphery of the substrate W. By the heat drying, as in the first embodiment, a layer of gas (gas layer) is formed on the surface of the substrate W, which has been supplied with a volatile solvent. Thus, the surface of the substrate W dries in an instant.

Described below is an example of another configuration in which the irradiator 10A of the line laser type irradiates the entire surface of the substrate W with laser beams.

Figure 9:
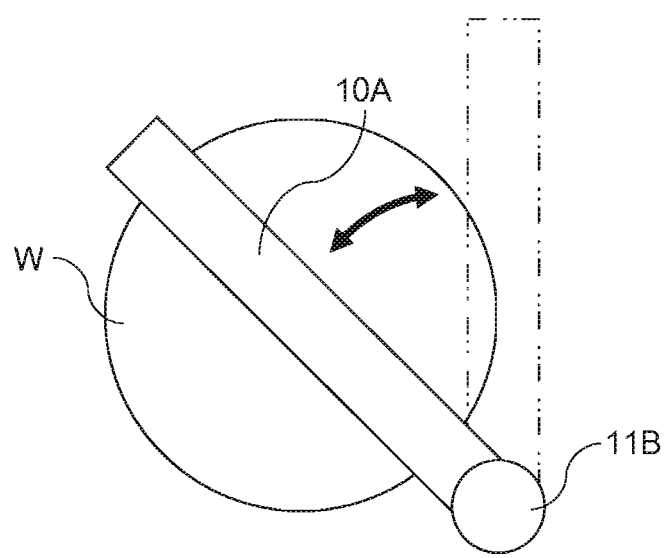
FIG. 9 is a plan view illustrating another example of the movement mechanism for the irradiator of the fourth embodiment.

As illustrated in FIG. 9, the irradiator 10A is provided above a movement mechanism 11B, which functions as a supporting column. The irradiator 10A is configured to be swingable (rotatable) by the movement mechanism 11B about the shaft center of the movement mechanism 11B as a rotation axis along the surface of the substrate W. The irradiator 10A is rotated about the rotation axis by the movement mechanism 11B, and emits laser beams while moving (swinging) in parallel along the surface of the substrate W on the rotating table 4, thereby irradiating the entire surface of the substrate W with the laser beams.

As described above, according to the fourth embodiment, the same effect as in the first embodiment can be achieved. Besides, a line laser is used as the irradiator 10A. As compared to such an irradiator that covers the entire surface of the substrate W on the table 4, the irradiator can be prevented from being increased in size.

Fifth Embodiment

A fifth embodiment will be described with reference to FIG. 10.

The fifth embodiment is basically similar to the first embodiment. Therefore, in the fifth embodiment, a description is given only of differences from the first embodiment. Like parts as described in the first embodiment are designated by like reference numerals, and the description thereof is omitted.

Figure 10:
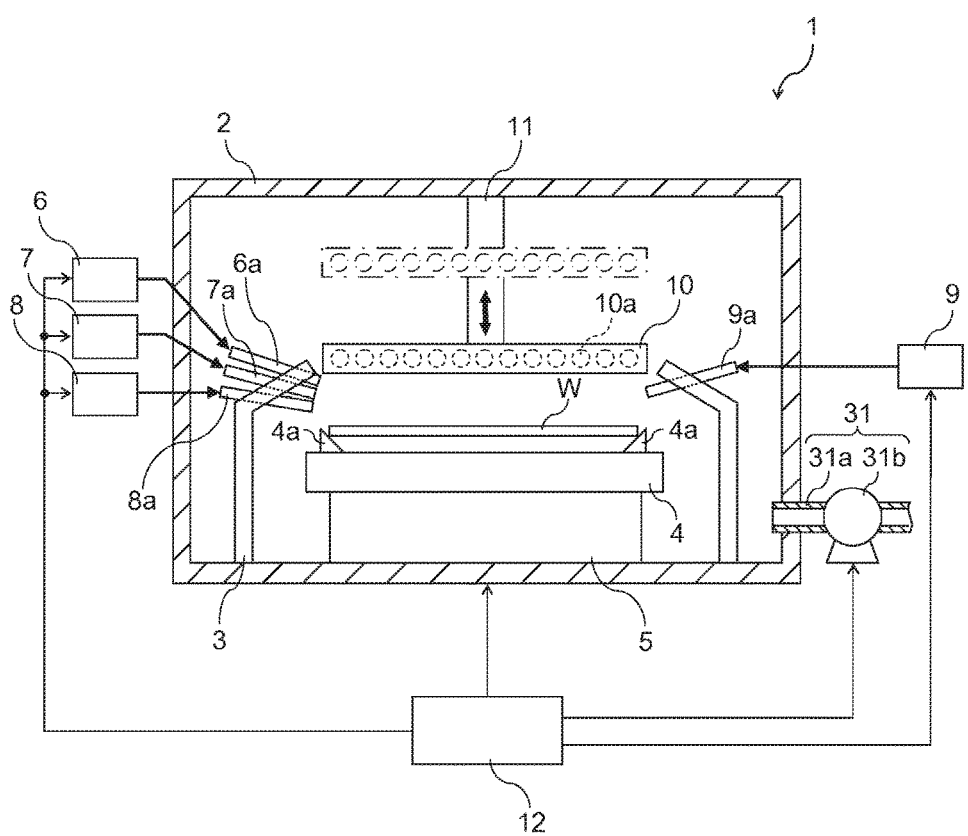
FIG. 10 is a diagram illustrating schematic structure of a substrate processing apparatus according to a fifth embodiment

As illustrated in FIG. 10, the substrate processing apparatus 1 of the fifth embodiment further includes a decompression unit 31 configured to depressurize the treatment box 2. The decompression unit 31 includes a pipe 31a leading into the treatment box 2, and a vacuum pump 31b arranged in the middle of the pipe 31a. The vacuum pump 31b is electrically connected to the controller 12, and operates under the control of the controller 12. With the vacuum pump 31b being driven, the decompression unit 31 evacuates gas from the treatment box 2 through the pipe 31a to depressurize the treatment box 2, thereby vacuumizing it.

With the substrate processing apparatus 1 of the fifth embodiment, prior to the heat drying by the irradiator 10, for example, after the supply of IPA as a volatile solvent (i.e., between step S5 and step S6 in FIG. 2 in the first embodiment), the decompression unit 31 depressurizes the treatment box 2 to a predetermined vacuum pressure. When the treatment box 2 is evacuated, the irradiator 10 performs the heat drying (step S6 in FIG. 2 in the first embodiment). At this time, the boiling point of IPA is reduced by the depressurization in the treatment box 2. By the reduction in the boiling point, the above-mentioned liquid ball phenomenon can be produced at a heating temperature lower than in the atmosphere. Thus, even if the substrate W to be treated is not suitable for high temperature heating, it can be subjected to the heat drying.

As described above, according to the fifth embodiment, the same effect as in the first embodiment can be achieved. Besides, the irradiator 10 performs the heat drying in the treatment box 2 which has been depressurized. This reduces the boiling point of a liquid present on the surface of the substrate W in the treatment box 2. By the reduction in the boiling point, the liquid ball phenomenon can be produced at a heating temperature lower than in the atmosphere. Therefore, compared to the heat drying by the irradiator 10 without depressurizing the treatment box 2, even if the substrate W to be treated is not suitable for high temperature heating, the heat drying is performed at a heating temperature lower than in the atmosphere. Thus, the substrate can be dried successfully while pattern collapse is reliably suppressed.

Sixth Embodiment

A sixth embodiment will be described with reference to FIG. 11.

The sixth embodiment is basically similar to the first embodiment. Therefore, in the sixth embodiment, a description is given only of differences from the first embodiment. Like parts as described in the first embodiment are designated by like reference numerals, and the description thereof is omitted.

Figure 11:
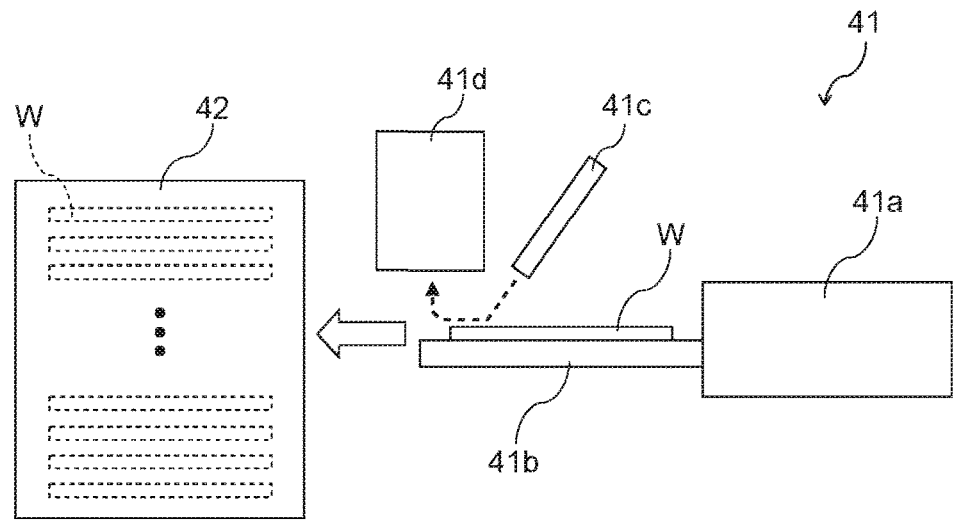
FIG. 11 is a diagram illustrating a schematic structure of a substrate processing apparatus according to a sixth embodiment

As illustrated in FIG. 11, the substrate processing apparatus 1 of the sixth embodiment further includes a transport unit 41 configured to transport the substrate W. The transport unit 41 transports the substrate W from the table 4 in the treatment box 2 to a buffer unit 42 that houses a plurality of substrates W. Incidentally, the substrate processing apparatus 1 of the sixth embodiment is not provided with the irradiator 10 of the first embodiment. In the substrate processing of the sixth embodiment, instead of the heat drying by the irradiator 10, spin-off drying is performed by the rotation of the substrate W.

The transport unit 41 includes a transport arm 41a that enables the transport of the substrate W between the treatment box 2 and the buffer unit 42, a transport arm heater 41b that is attached to the transport arm 41a to support the substrate W, a gas blower 41c configured to blow gas (e.g., an inert gas such as nitrogen gas) to the substrate W on the transport arm heater 41b, and an exhaust unit 41d configured to suck and exhaust the gas returning from the substrate W.

The transport arm heater 41b is configured to heat the substrate W instantaneously to a high temperature during the transport of the substrate W. The transport arm heater 41b supports the substrate W, and serves as a heater for heating the substrate W. The transport arm heater 41b heats the substrate W, which has been supplied with a volatile solvent, to produce a layer of gas (air layer) on the surface thereof as in the first embodiment. Incidentally, the substrate W is taken out from the treatment box 2 in a state that only spin-off drying is performed therein. Accordingly, when the substrate W is placed on the transport arm heater 41b, the volatile solvent is not completely dried (some solvent remains).

The gas blower 41c and the exhaust unit 41d are arranged along the transport path of the substrate W from the treatment box 2 to the buffer unit 42 (a path along which the substrate W is transported by the transport arm 41a). The gas blower 41c is located in the upstream of the exhaust unit 41d in the transport direction of the substrate W. Accordingly, the exhaust unit 41d is located in the downstream of the gas blower 41c, and is arranged to suck the gas blown out by the gas blower 41c and striking the surface of the substrate W.

The gas blower 41c is configured to blow off the liquid ball of volatile solvent generated on the surface of the substrate W to thereby remove it by heating of the transport arm heater 41b. The gas blower 41c is located above the transport path of the substrate W, and is arranged to be inclined with respect to the surface of the substrate W on the transport arm heater 41b. The gas blower 41c includes a slit-like opening (not illustrated) having a width substantially equal to or larger than the width of the substrate W in a direction perpendicular to its transport direction, and blows gas from the opening.

The exhaust unit 41d sucks liquid balls blown off by the gas blower 41c so that they are not scattered on the transport path. The exhaust unit 41d is located above the transport path of the substrate W, and is arranged to be perpendicular to the surface of the substrate W on the transport arm heater 41b. The exhaust unit 41d includes a slit-like opening (not illustrated) having a width substantially equal to or larger than the width of the substrate W in a direction perpendicular to its transport direction, and sucks gas through the opening.

In the substrate processing apparatus 1 of the sixth embodiment, the substrate W taken out from the treatment box 2 is placed on the transport arm heater 41b in which the heater is off. In this state, the transport arm 41a moves from right to left in FIG. 11. The heater is turned on when the transport arm heater 41b comes close to the gas blower 41c, and thereby the substrate W is rapidly heated. This heating generates a liquid ball of volatile solvent on the surface of the substrate W. Thereafter, the liquid ball of volatile solvent is blown off from the surface of the substrate W by the gas from the gas blower 41c, and is sucked by the exhaust unit 41d to be removed. With this, the surface of the substrate W dries instantly. Note that, while being heated, the substrate W is transported in one direction without rotating.

As described above, according to the sixth embodiment, the same effect as in the first embodiment can be achieved. Besides, in course of the transport of the substrate W, the substrate W is heated and dried by the transport arm heater 41b. Thus, the substrate can be dried successfully without heat drying in the treatment box 2 while pattern collapse is reliably suppressed. This makes it possible to dispense with the heat drying in the treatment box 2, thereby reducing the substrate processing time in the treatment box 2.

While, in the sixth embodiment, the gas blower 41c and the exhaust unit 41d are arranged above the transport path of the substrate W (to be located above the substrate W), this is not a limitation. For example, the gas blower 41c may be located on the side of the transport path of the substrate W, and the exhaust unit 41d may be on the opposite side. In this case, gas is blown from the side to the surface of the substrate W on the transport arm heater 41b, and is sucked from the opposite side.

Further, regarding a liquid ball of volatile solvent generated on the surface of the substrate W due to rapid heating by the transport arm heater 41b, it may be removed from the surface by tilting the substrate W. This can be implemented in course of the transport of the substrate W by rotating the transport arm 41a about, for example, an axis along the transport direction after rapid heating of the substrate W by the transport arm heater 41b to tilt the substrate W being held. As the substrate W is tilted, the liquid ball of volatile solvent is slide on the surface of the substrate W and thus removed therefrom.

While certain embodiments have been described, these embodiments have been presented by way of example only, and are not intended to limit the scope of the inventions. For example, the supplies of the first treatment liquid, the second treatment liquid, gas, volatile solvent, and the like have been described in the embodiments as not overlapping in time; however, they may partly overlap. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A substrate processing apparatus comprising:
a table configured to support a substrate horizontally;
a rotation actuator configured to rotate the table in a horizontal plane;
a treatment liquid supplier configured to supply a treatment liquid to a surface of the substrate that is rotating;
a solvent supplier configured to supply a liquid volatile solvent to the surface of the rotating substrate that is supplied with the treatment liquid;
a heater configured to heat the rotating substrate such that a gas layer is formed on the surface of the substrate, which has been supplied with the volatile solvent, to make the volatile solvent into a liquid ball; and
a controller configured to control the heater not to heat the substrate while the solvent supplier is supplying the volatile solvent to the substrate, and to start heating the substrate where the liquid volatile solvent remains after completion of supply of the volatile solvent.

2. The substrate processing apparatus according to claim 1, further comprising a movement actuator configured to move the heater vertically with respect to the surface of the substrate.

3. The substrate processing apparatus according to claim 1, wherein the heater is an irradiator configured to irradiate the surface of the substrate, which has been supplied with the volatile solvent, with electromagnetic waves.

4. The substrate processing apparatus according to claim 1, wherein the treatment liquid is pure water and the volatile solvent is IPA.

5. The substrate processing apparatus according to claim 1, further comprising a gas supplier configured to supply an inert gas to the surface of the substrate,
wherein the controller is further configured to control the gas supplier to start supplying the inert gas before the solvent supplier starts supplying the volatile solvent.

6. The substrate processing apparatus according to claim 5, further comprising a cup configured to surround a periphery of the table to accommodate the table therein, wherein
the treatment liquid supplier includes a first nozzle configured to supply the treatment liquid to the substrate,
the solvent supplier includes a second nozzle configured to supply the volatile solvent to the substrate,
the gas supplier includes a third nozzle configured to supply the inert gas to the substrate, and
the first nozzle, the second nozzle, and the third nozzle are arranged on an upper portion of a peripheral wall of the cup.

7. The substrate processing apparatus according to claim 1, further comprising a cup configured to surround a periphery of the table to accommodate the table therein, wherein
the treatment liquid supplier includes a first nozzle configured to supply the treatment liquid to the substrate,
the solvent supplier includes a second nozzle configured to supply the volatile solvent to the substrate, and
the first nozzle and the second nozzle are arranged on an upper portion of a peripheral wall of the cup.

8. The substrate processing apparatus according to claim 1, further comprising:
a treatment box configured to house the table; and
a pump configured to depressurize inside of the treatment box,
wherein the controller is further configured to control the pump to depressurize the inside of the treatment box to a predetermined vacuum pressure after the solvent supplier finishes supplying the volatile solvent, and then control the heater to start heating the substrate.

9. A substrate processing method comprising:
supplying a treatment liquid to a surface of the substrate that is rotating in a horizontal plane;
supplying a liquid volatile solvent to the surface of the rotating substrate that is supplied with the treatment liquid; and
heating the rotating substrate such that a gas layer is formed on the surface of the substrate, which has been supplied with the volatile solvent, to make the volatile solvent into a liquid ball, wherein
the heating is not performed while the volatile solvent is being supplied to the substrate, and
the heating is started for the substrate where the liquid volatile solvent remains after completion of supply of the volatile solvent.

10. The substrate processing method according to claim 9, wherein the heating is performed by irradiating the surface of the substrate, which has been supplied with the volatile solvent, with electromagnetic waves.

* * * * *